United States Patent
Takami et al.

(10) Patent No.: US 10,263,028 B2
(45) Date of Patent: Apr. 16, 2019

(54) SOLID-STATE IMAGE PICKUP APPARATUS AND METHOD OF MANUFACTURING THE SAME

(71) Applicant: CANON KABUSHIKI KAISHA, Tokyo (JP)

(72) Inventors: Koki Takami, Sagamihara (JP); Takeshi Aoki, Oita (JP); Yusuke Onuki, Fujisawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 7 days.

(21) Appl. No.: 15/467,919

(22) Filed: Mar. 23, 2017

(65) Prior Publication Data

US 2017/0294470 A1    Oct. 12, 2017

(30) Foreign Application Priority Data

Apr. 6, 2016 (JP) .................. 2016-076379

(51) Int. Cl.
*H04N 5/335*    (2011.01)
*H01L 27/146*    (2006.01)
(Continued)

(52) U.S. Cl.
CPC .. *H01L 27/14629* (2013.01); *H01L 27/14621* (2013.01); *H01L 27/14625* (2013.01); *H01L 27/14627* (2013.01); *H01L 27/14636* (2013.01); *H01L 27/14645* (2013.01); *H01L 27/14685* (2013.01); *H04N 5/374* (2013.01); *H04N 5/378* (2013.01)

(58) Field of Classification Search
CPC .................................. H01L 27/14629
USPC .......................................... 348/308
See application file for complete search history.

(56) References Cited

U.S. PATENT DOCUMENTS 7,749,788 B2    7/2010    Okagawa
7,842,988 B2    11/2010    Okagawa
(Continued)

FOREIGN PATENT DOCUMENTS

| JP | 2008-192951 | 8/2008 |
|----|-------------|--------|
| JP | 2012-186396 | 9/2012 |
| JP | 2014-36037  | 2/2014 |

OTHER PUBLICATIONS

U.S. Appl. No. 15/584,718, filed May 2, 2017.

*Primary Examiner* — Usman A Khan
(74) *Attorney, Agent, or Firm* — Venable LLP (57) ABSTRACT

Provided are a solid-state image pickup apparatus which includes: a semiconductor substrate having a plurality of photoelectric converters; a first and a second insulating layers formed on the semiconductor substrate; an optical waveguide formed above each of the plurality of photoelectric converters and in an opening portion of the first and the second insulating layers, and has a refractive index higher than a refractive index of the first insulating layer; and a light reflecting layer formed at a boundary between the optical waveguide and the second insulating layer, and has a refractive index lower than a refractive index of the optical waveguide, where the following expression is satisfied: α<90°, where α represents an angle formed by a boundary surface between the light reflecting layer and the second insulating layer with respect to a boundary surface between the first insulating layer and the second insulating layer.

22 Claims, 9 Drawing Sheets (51) Int. Cl.
    *H04N 5/374*    (2011.01)
    *H04N 5/378*    (2011.01)

(56)            References Cited

U.S. PATENT DOCUMENTS

| | | | |
|---|---|---|---|
| 8,115,848 | B2 | 2/2012 | Onuki |
| 8,427,564 | B2 | 4/2013 | Yamashita |
| 8,736,734 | B2 | 5/2014 | Onuki |
| 9,024,405 | B2 | 5/2015 | Aoki |
| 9,239,423 | B2 | 1/2016 | Naruse |
| 2004/0202418 | A1* | 10/2004 | Ghiron ............... G02B 6/34 <br> 385/36 |
| 2006/0220073 | A1* | 10/2006 | Kooriyama ......... H01L 27/1462 <br> 257/257 |
| 2007/0280326 | A1* | 12/2007 | Piede ................. H01S 5/06804 <br> 372/102 |
| 2009/0166518 | A1 | 7/2009 | Tay |
| 2013/0037902 | A1* | 2/2013 | Nakazawa ........ H01L 27/14623 <br> 257/432 |
| 2013/0076970 | A1* | 3/2013 | Kishi .................. G02B 7/34 <br> 348/349 |
| 2013/0206965 | A1 | 8/2013 | Yamashita |
| 2014/0042576 | A1 | 2/2014 | Toyoda |
| 2015/0264283 | A1 | 9/2015 | Kobayashi |
| 2015/0349015 | A1 | 12/2015 | Yamaguchi |
| 2017/0078557 | A1 | 3/2017 | Kawabata |
| 2017/0078594 | A1 | 3/2017 | Kawabata |
| 2017/0078604 | A1 | 3/2017 | Kobayashi |

\* cited by examiner

SOLID-STATE IMAGE PICKUP APPARATUS AND METHOD OF MANUFACTURING THE SAME

BACKGROUND OF THE INVENTION

Field of the Invention

The present invention relates to a technology of increasing an SN ratio of a pixel signal in a solid-state image pickup apparatus.

Description of the Related Art

In recent years, there has been proposed a solid-state image pickup apparatus including an optical waveguide configured to guide incident light to a photoelectric converter of a pixel in order to increase the amount of light that enters the photoelectric converter. For example, in the technology described in Japanese Patent Application Laid-Open No. 2014-36037, a high refractive index region serving as the optical waveguide is formed between an inner lens configured to collect light obtained from an object and the photoelectric converter configured to photoelectrically convert the incident light. Further, in a connection member layer formed between the inner lens and the optical waveguide, a light shielding portion configured to prevent mixture of light to an adjacent pixel is formed.

However, even in the solid-state image pickup apparatus having the light shielding portion, light that has passed through the inner lens of the pixel may mix into the photoelectric converter of the adjacent pixel. For example, in the technology described in Japanese Patent Application Laid-Open No. 2014-36037, there has been a problem in that light entering a region between the waveguide member and the light shielding portion leaks out to the adjacent pixel or leaks in from the adjacent pixel via the connection member or an insulator.

SUMMARY OF THE INVENTION

According to one embodiment of the present invention, there is provided a solid-state image pickup apparatus, including: a semiconductor substrate, which has a plurality of photoelectric converters formed thereon; a first insulating layer, which is formed on the semiconductor substrate, and includes a wiring line; a second insulating layer, which is formed on the first insulating layer; an optical waveguide, which is formed above each of the plurality of photoelectric converters and in an opening portion of the first insulating layer and the second insulating layer, and has a refractive index that is higher than a refractive index of the first insulating layer; and a light reflecting layer, which is formed at a boundary between the optical waveguide and the second insulating layer, and has a refractive index that is lower than a refractive index of the optical waveguide, in which the following expression is satisfied: $\alpha<90°$, where $\alpha$ represents an angle formed by a boundary surface between the light reflecting layer and the second insulating layer with respect to a boundary surface between the first insulating layer and the second insulating layer.

Further, according to another embodiment of the present invention, there is provided a method of manufacturing a solid-state image pickup apparatus, the method including: forming a plurality of photoelectric converters on a semiconductor substrate; forming a first insulating layer on the semiconductor substrate; forming an opening portion in the first insulating layer above each of the plurality of photoelectric converters; forming a second insulating layer on the first insulating layer; forming an optical waveguide by filling the opening portion with a buried member having a refractive index that is higher than a refractive index of the first insulating layer; and forming, at a boundary between the optical waveguide and the second insulating layer, a light reflecting layer having a refractive index that is lower than a refractive index of the optical waveguide, in which the following expression is satisfied: $\alpha<90°$, where $\alpha$ represents an angle formed by a boundary surface between the light reflecting layer and the second insulating layer with respect to a boundary surface between the first insulating layer and the second insulating layer.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
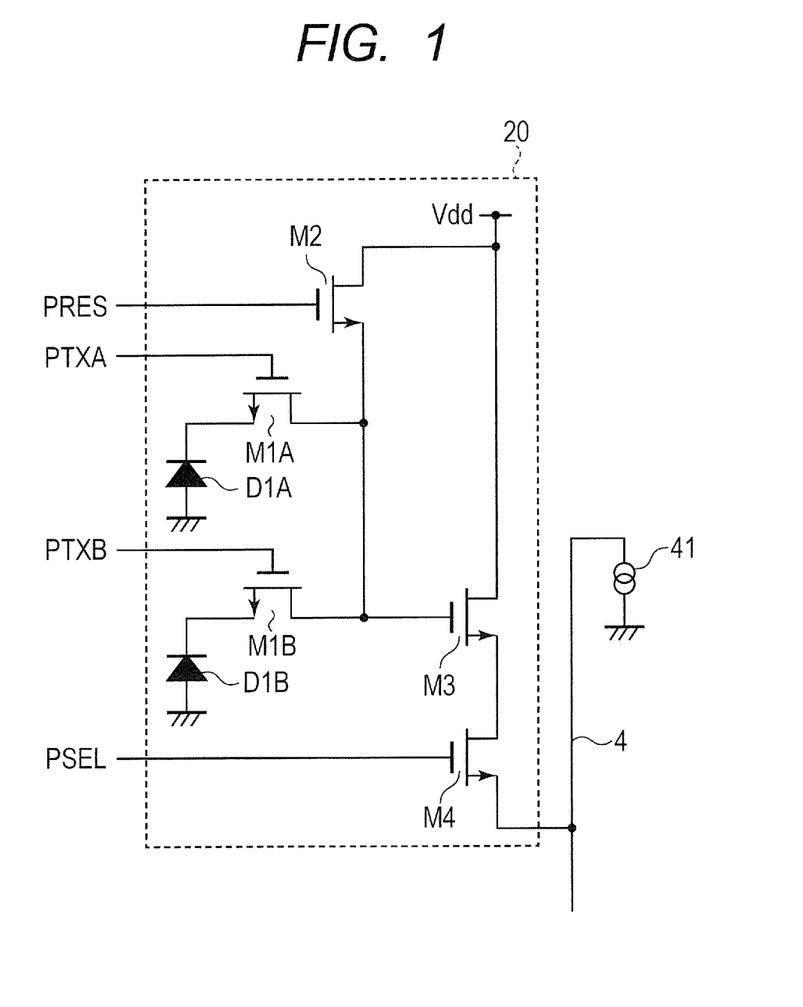
FIG. 1 is a schematic diagram for illustrating a configuration of a pixel of a solid-state image pickup apparatus according to a first embodiment of the present invention.

FIG. 1 is a schematic diagram for illustrating a configuration of a pixel 20 of a solid-state image pickup apparatus according to a first embodiment of the present invention. The pixel 20 illustrated in FIG. 1 includes photoelectric converters D1A and D1B, transfer transistors M1A and M1B, a reset transistor M2, an amplification transistor M3, and a selection transistor M4. The transfer transistors M1A and M1B, the reset transistor M2, and the selection transistor M4 are controlled by control signals PTXA, PTXB, PRES, and PSEL, respectively, which are output from a vertical scanning circuit (not shown). As those transistors, for example, MOS transistors may be used. An example in which an N-channel MOS is used is illustrated in FIG. 1, but a P-channel MOS may also be used.

The photoelectric converters D1A and D1B are each configured to photoelectrically convert incident light to accumulate photoelectrically converted charges. The transfer transistors M1A and M1B are controlled by the control signals PTXA and PTXB, respectively, so as to transfer the photoelectrically converted charges from the photoelectric converters D1A and D1B to an input node. In this case, the input node refers to a floating diffusion region (hereinafter referred to as "FD region") formed at nodes of four terminals, specifically, the drains of the transfer transistors M1A and M1B, the source of the reset transistor M2, and the gate of the amplification transistor M3.

In the FD region, the photoelectrically converted charges transferred from the photoelectric converters D1A and D1B are held. The amplification transistor M3 constructs, together with a constant current source 41, a source follower circuit, and is configured to amplify a signal that is based on the photoelectrically converted charges held in the FD region to output the amplified signal as a pixel signal. The selection transistor M4 is controlled by the control signal PSEL, and is configured to select the pixel 20 connected to a column signal line 4. As a result, the pixel signal that is based on the photoelectrically converted charges held in the FD region of the selected pixel 20 is output to the column signal line 4. The reset transistor M2 is controlled by the control signal PRES, and is configured to reset the photoelectrically converted charges held in the FD region.

In FIG. 1, an example in which the pixel 20 includes two photoelectric converters D1A and D1B is illustrated, but this embodiment is not limited to such a configuration. For example, the pixel 20 may include only one photoelectric converter.

Figure 2:
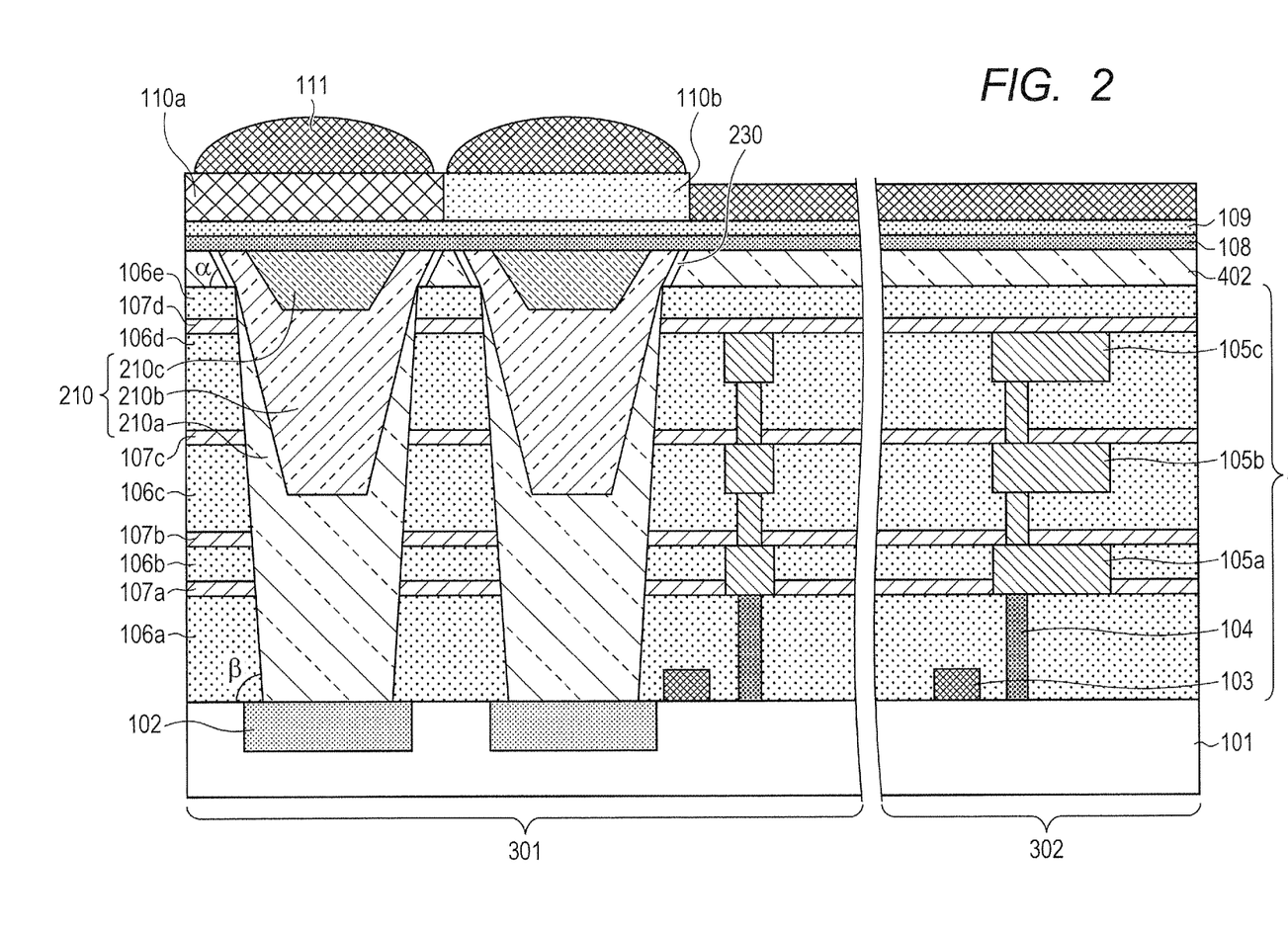
FIG. 2 is a sectional view for illustrating a schematic configuration of the solid-state image pickup apparatus according to the first embodiment.

FIG. 2 is a sectional view for illustrating a schematic configuration of the solid-state image pickup apparatus according to the first embodiment. The solid-state image pickup apparatus of this embodiment includes a semiconductor substrate 101, photoelectric converters 102, optical waveguides 210, a first insulating layer 401, and a second insulating layer 402. In FIG. 2, on the optical waveguides 210 and the second insulating layer 402, there are further formed a passivation film 108, a planarizing layer 109, a color filter layer 110, and an on-chip lens layer 111. Now, with reference to FIG. 2, respective components of the solid-state image pickup apparatus are described.

In a pixel region 301 of the semiconductor substrate 101, the photoelectric converters 102 for a plurality of pixels are formed. Further, for example, a gate electrode 103 of the MOS transistor configured to read out the pixel signal that is based on the charges photoelectrically converted by the photoelectric converter 102 is formed. Further, in a peripheral circuit region 302 of the semiconductor substrate 101, for example, a circuit for processing the pixel signal read out from the pixel is formed.

On the semiconductor substrate 101, the first insulating layer 401 is formed. For example, the first insulating layer 401 illustrated in FIG. 2 includes a conductive plug 104, a wiring line 105, an insulating film 106, and an insulating film 107. On the first insulating layer 401, the second insulating layer 402 is further formed.

The wiring line 105 includes wiring layers 105a to 105c each containing copper as the main component, for example. Further, the insulating film 106 includes insulating films 106a to 106e, each containing silicon oxide as the main component, for example, and are formed between the respective wiring layers 105a to 105c. The insulating film 107 includes insulating films 107a to 107d, each containing silicon carbide or silicon nitride as the main component, for example, and have one or both of a copper diffusion prevention function or an etching stop function.

Opening portions are formed through the first insulating layer 401 and the second insulating layer 402 positioned above the photoelectric converters 102, and the optical waveguides 210 are formed in the opening portions. For example, each of the opening portions is formed to pass through the second insulating layer 402 to reach an etching stop layer (not shown) formed in the first insulating layer 401. Each of the optical waveguides 210 has a refractive index that is higher than that of the insulating film 106, and is configured to guide light that has passed through the on-chip lens layer 111 and entered the optical waveguide 210 to the photoelectric converter 102. The optical waveguide 210 includes a first buried member 210a, a second buried member 210b, and a third buried member 210c. The buried members 210a to 210c may be made of the same material, or may be made of different materials. For example, a material containing silicon nitride as the main component may be used.

The second insulating layer 402 is configured to protect the first insulating layer 401. The second insulating layer 402 is made of, for example, the same material as the first buried member 210a containing silicon nitride or the like as the main component. A light reflecting layer 230 is formed at a boundary between the second insulating layer 402 and the optical waveguide 210.

The light reflecting layer 230 is formed so as to extend obliquely on an outer side of the optical waveguide 210 and at the boundary between the optical waveguide 210 and the second insulating layer 402. That is, the light reflecting layer 230 is formed so as to satisfy Expression (1):

$$\alpha < 90° \qquad (1),$$

where $\alpha$ represents an angle formed by a boundary surface between the light reflecting layer 230 and the second insulating layer 402 with respect to a boundary surface between the first insulating layer 401 and the second insulating layer 402.

It is more preferred that the light reflecting layer 230 be formed so as to satisfy Expression (2):

$$\alpha < \beta \qquad (2),$$

where $\beta$ represents an angle formed by a boundary surface between the optical waveguide 210 and the first insulating layer 401 with respect to a boundary surface between the semiconductor substrate 101 and the first insulating layer 401.

The light reflecting layer 230 may be a light reflecting material or may be an air gap as long as the light reflecting layer 230 has a refractive index that is lower than that of the first buried member 210a. Further, the light reflecting layer 230 may be formed at the boundary between the second insulating layer 402 and the optical waveguide 210, or may be formed on the first buried member 210a side, on the first insulating layer 401 side, or on the second insulating layer 402 side.

The light reflecting layer 230 may reflect the light entering a region between a corresponding pixel and a pixel adjacent thereto to collect the light toward the optical waveguide 210. Therefore, leaking-out or leaking-in of light entering a region between adjacent pixels can be suppressed, and the amount of light to be received by the photoelectric converter 102 of the pixel can be increased.

In FIG. 2, on the optical waveguides 210 and the first insulating layer 401, the passivation film 108 and the planarizing layer 109 made of resin are further formed. Further, color filter layers 110a and 110b corresponding to a plurality of colors and the on-chip lens layer 111 are formed. Those layers are not necessarily limited to the configuration illustrated in FIG. 2, and, for example, an inner lens (not shown) may be formed above the optical waveguide 210.

As described above, the solid-state image pickup apparatus of this embodiment includes the light reflecting layer, which is formed at the boundary between the optical waveguide and the second insulating layer, and has a refractive index lower than a refractive index of the optical waveguide. Further, $\alpha<90°$ is satisfied, where α represents an angle formed by the boundary surface between the light reflecting layer and the second insulating layer with respect to the boundary surface between the first insulating layer and the second insulating layer. With this, the leaking-out or the leaking-in of the light entering a region between adjacent pixels can be suppressed, and the amount of light to be received by the photoelectric converter of the pixel can be increased. Thus, the SN ratio of the pixel signal can be increased.

Second Embodiment

FIG. 3 to FIG. 8 are schematic views of the sectional structure of the solid-state image pickup apparatus, for illustrating respective steps of a method of manufacturing a solid-state image pickup apparatus according to a second embodiment of the present invention. Now, the method of manufacturing the solid-state image pickup apparatus illustrated in FIG. 2 is described with reference to FIG. 3 to FIG. 8. Description of known technologies is sometimes omitted herein.

Figure 3:
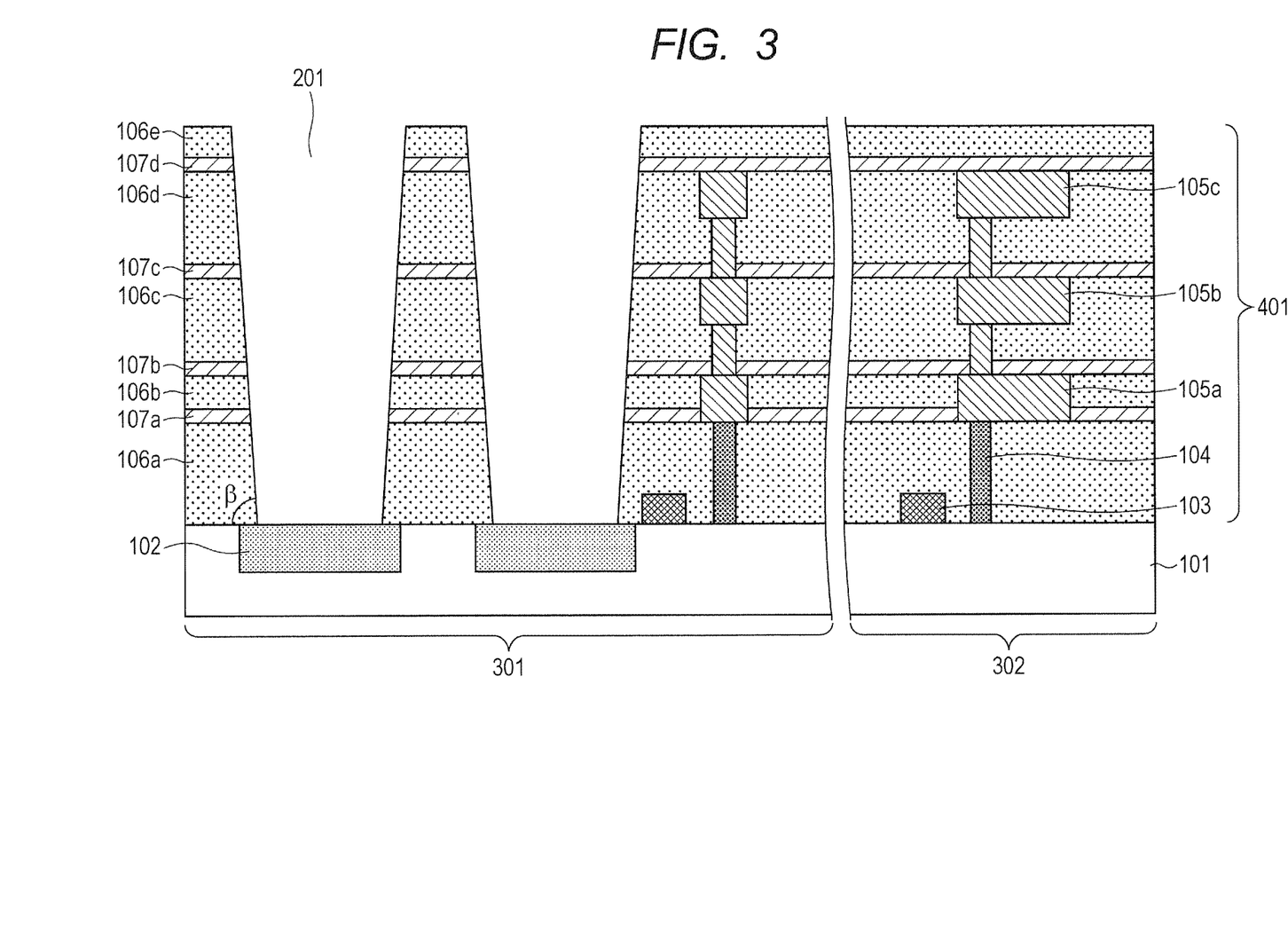
FIG. 3 is a schematic view for illustrating a step of forming a first insulating layer having opening portions in a method of manufacturing a solid-state image pickup apparatus according to a second embodiment of the present invention.

FIG. 3 is a schematic view for illustrating a step of forming, on the semiconductor substrate 101, the first insulating layer 401 having opening portions 201. First, in the pixel region 301 of the semiconductor substrate 101, the plurality of photoelectric converters 102 are formed. Then, for example, the gate electrode 103 of the MOS transistor configured to read out the pixel signal that is based on the charges photoelectrically converted by the photoelectric converter 102 is formed. With this, a plurality of pixels are formed in the pixel region 301. Further, in the peripheral circuit region 302 of the semiconductor substrate 101, for example, a circuit for processing the pixel signal read out from the pixel is formed.

Next, on the semiconductor substrate 101, the insulating film 106a made of, for example, silicon oxide is formed with use of chemical vapor deposition (CVD) or other methods. Further, the conductive plug 104 and the like are formed. Next, the insulating film 107a made of, for example, silicon carbide is formed, and the insulating film 106b made of, for example, silicon oxide is formed. Next, the wiring layer 105a containing copper as the main component is formed with use of a Damascene method or other methods. With similar methods, the insulating film 107b, the insulating film 106c, the wiring layer 105b, the insulating film 107c, the insulating film 106d, the wiring layer 105c, the insulating film 107d, and the insulating film 106e are formed.

In this manner, on the semiconductor substrate 101, the first insulating layer 401 including the conductive plug 104, the wiring line 105, the insulating film 106, and the insulating film 107 is formed. The first insulating layer 401 is not necessarily limited to the configuration illustrated in FIG. 3. For example, the wiring line 105, the insulating film 106, and the insulating film 107 may each include a larger number of layers.

Next, above regions of the semiconductor substrate 101 in which the photoelectric converters 102 are formed, the opening portions 201 are formed so as to reach the etching stop layer (not shown) formed in the first insulating layer 401. The opening portions 201 are formed by forming a resist pattern with use of photolithography or other methods and then using plasma etching or other methods. The opening portions 201 are each formed so as to satisfy Expression (3):

$$\beta<90 \qquad (3),$$

where β represents an angle formed by the boundary surface between the opening portion 201 and the first insulating layer 401 with respect to the boundary surface between the semiconductor substrate 101 and the first insulating layer 401.

Figure 4:
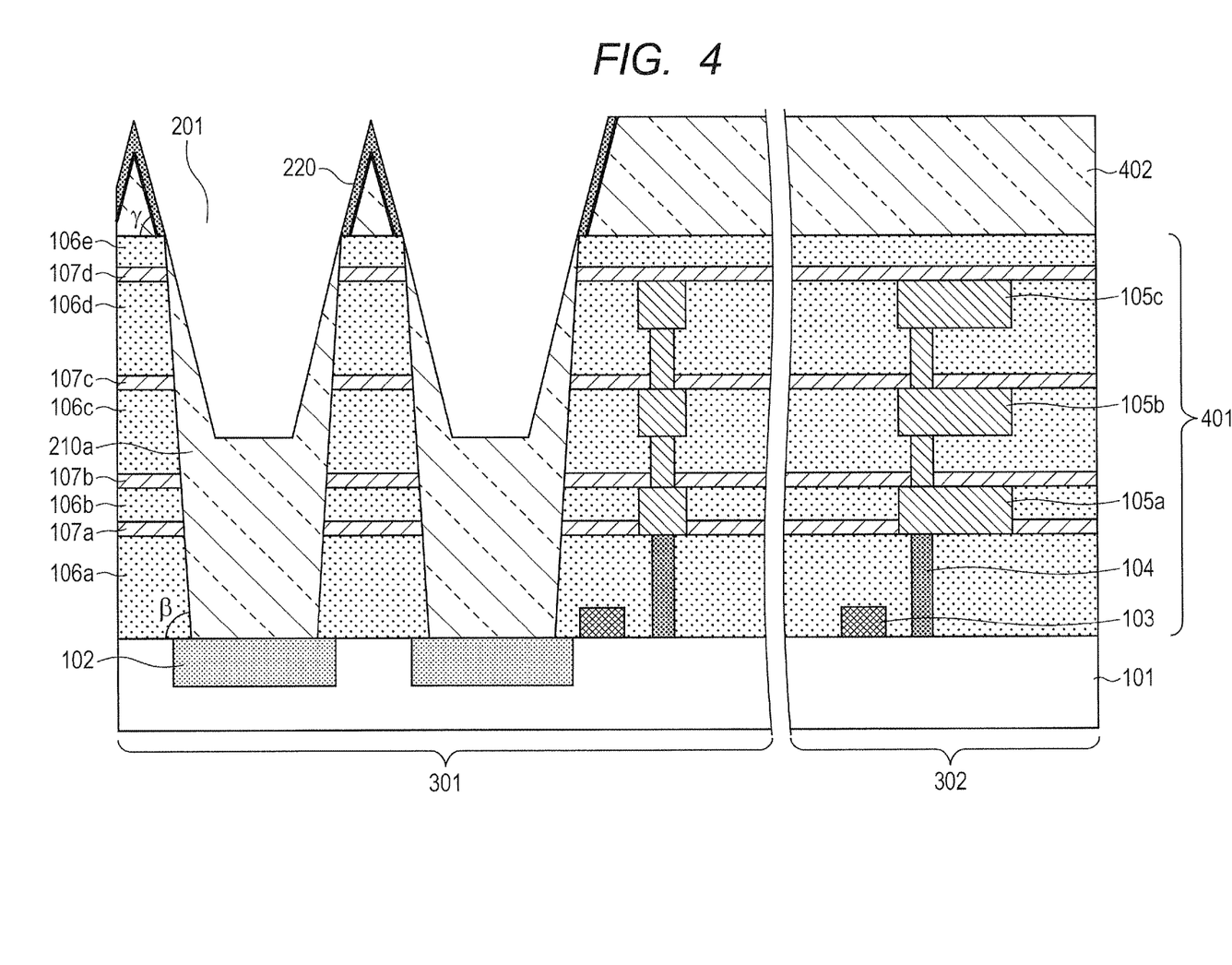
FIG. 4 is a schematic view for illustrating a step of forming a high etching rate layer in the method of manufacturing a solid-state image pickup apparatus according to the second embodiment.

FIG. 4 is a schematic view for illustrating a step of forming the second insulating layer 402 and a high etching rate layer 220 on the first insulating layer 401. With a film forming device using plasma, for example, high-density plasma CVD, the opening portions 201 are filled with a material containing, for example, silicon nitride as the main component, to thereby form the first buried members 210a. At this time, on the first insulating layer 401, the second insulating layer 402 made of the same material as the first buried member 210a is formed. As described above, in the step illustrated in FIG. 4, the first buried members 210a and the second insulating layer 402 are simultaneously formed, and hence the step can be simplified. The first buried members 210a and the second insulating layer 402 may be formed with use of different materials in different steps.

The step of forming the second insulating layer 402 is carried out such that the boundary surface between the opening portion 201 and the second insulating layer 402 extends obliquely on the outer side of the optical waveguide 210. That is, the second insulating layer 402 is formed so as to satisfy Expression (4):

$$\gamma<90° \qquad (4),$$

where γ represents an angle formed by the boundary surface between the opening portion 201 and the second insulating layer 402 with respect to the boundary surface between the first insulating layer 401 and the second insulating layer 402. This angle γ is substantially equal to the angle α of the first embodiment in FIG. 2.

It is more preferred that the second insulating layer 402 be formed so as to satisfy Expression (5):

$$\gamma<\beta \qquad (5),$$

where β represents an angle formed by the boundary surface between the optical waveguide 210 and the first insulating layer 401 with respect to the boundary surface between the semiconductor substrate 101 and the first insulating layer 401. For example, in the step illustrated in FIG. 4, the second insulating layer 402 is formed simultaneously with the first buried members 210a, and hence the angle γ may be small. Therefore, Expression (5) may be easily satisfied.

Next, on the second insulating layer 402, the high etching rate layer 220 is formed with use of gas of, for example, Ar, which has a sputtering property. The high etching rate layer 220 is made of, for example, silicon oxide having an etching rate higher than that of the buried member 210a.

Figure 5:
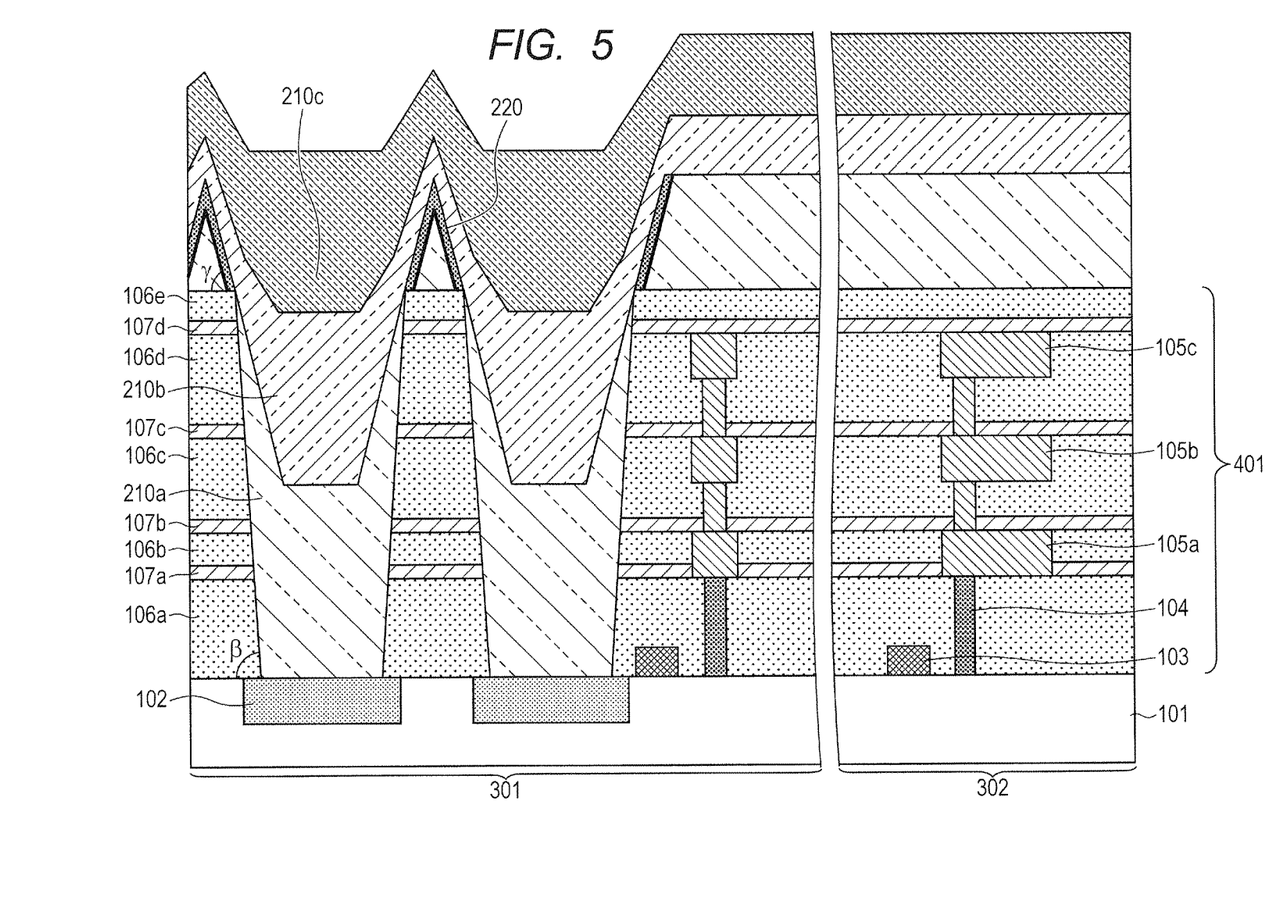
FIG. 5 is a schematic view for illustrating a step of forming an optical waveguide in the method of manufacturing a solid-state image pickup apparatus according to the second embodiment.

FIG. 5 is a schematic view for illustrating a step of forming the optical waveguides 210 in the opening portions 201. With a method similar to that used when the first buried members 210a are formed in the opening portions 201, the second buried member 210b and the third buried member 210c are formed in the opening portions 201. The same material or different materials may be used for the buried members 210a to 210c. For example, a material containing silicon nitride as the main component is used. Further, the step of forming the buried members 210a to 210c is not necessarily limited to be divided into three steps.

Figure 6:
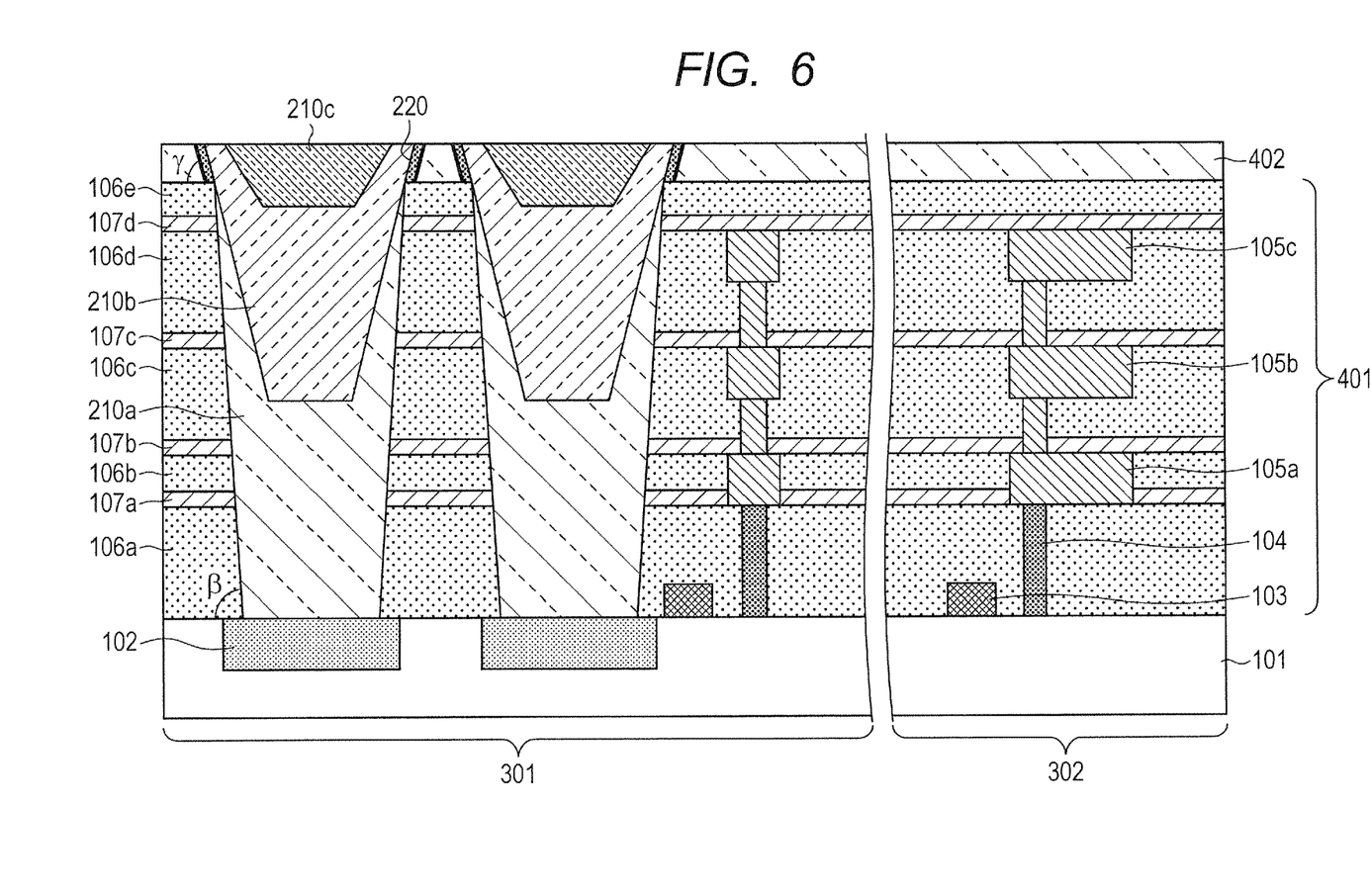
FIG. 6 is a schematic view for illustrating a step of forming a second insulating layer in the method of manufacturing a solid-state image pickup apparatus according to the second embodiment.

FIG. 6 is a schematic view for illustrating a step of forming the second insulating layer 402 on the first insulating layer 401. The buried members 210a to 210c are polished by chemical mechanical polishing (CMP) or other methods, to perform planarizing until the high etching rate layer 220 is exposed. At this time, polishing is performed so that the buried member 210a accumulated on the first insulating layer 401 remains by from about 50 nm to about 350 nm. This embodiment is not limited to this film thickness. With this, on the first insulating layer 401, the second insulating layer 402 made of the same material as the first buried member 210a is formed.

Figure 7:
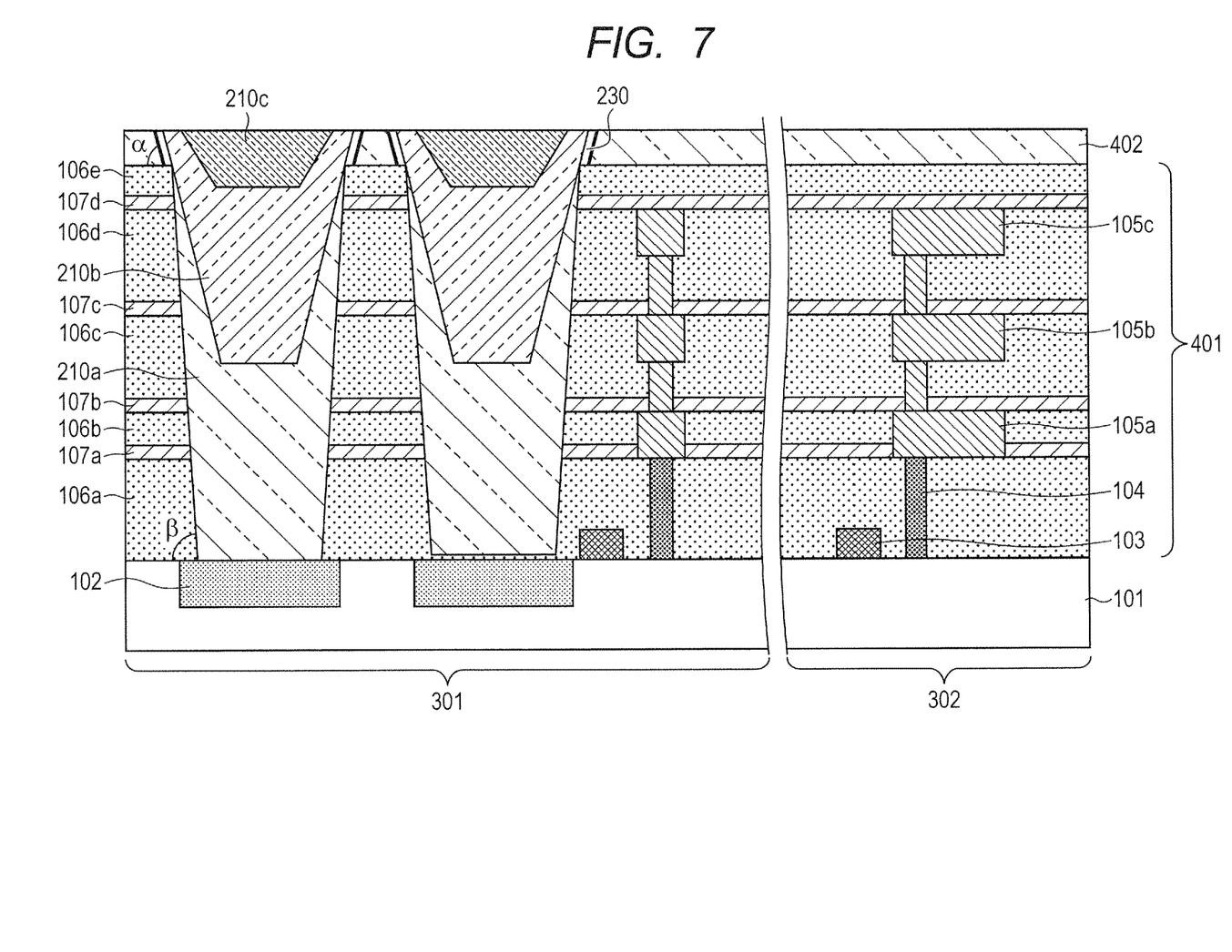
FIG. 7 is a schematic view for illustrating a step of forming a light reflecting layer in the method of manufacturing a solid-state image pickup apparatus according to the second embodiment.

FIG. 7 is a schematic view for illustrating a step of forming the light reflecting layer 230. The high etching rate layer 220 illustrated in FIG. 6 has an etching rate higher than those of the buried members 210a to 210c. Therefore, when the high etching rate layer 220 is subjected to wet etching by a hydrofluoric acid treatment or the like, the high etching rate layer 220 is removed to form the light reflecting layer 230 being an air gap having a low refractive index. Other than forming the high etching rate layer 220 in the step illustrated in FIG. 4, a low refractive index layer having a refractive index lower than that of the first buried member 210a may be formed, and the low refractive index layer may be left as the light reflecting layer 230.

The light reflecting layer 230 can reflect light entering a region between a corresponding pixel and a pixel adjacent thereto to collect the light toward the optical waveguide 210. Therefore, leaking-out or leaking-in of light entering a region between adjacent pixels can be suppressed, and the amount of light to be received by the photoelectric converter 102 of the pixel can be increased.

The angle α in FIG. 7 is substantially equal to the angle γ in FIG. 4 to FIG. 6. Therefore, in the step of forming the high etching rate layer 220 illustrated in FIG. 4, when the angle γ is controlled such that Expression (4) or Expression (5) is satisfied, Expression (1) or Expression (2) may be satisfied.

Figure 8:
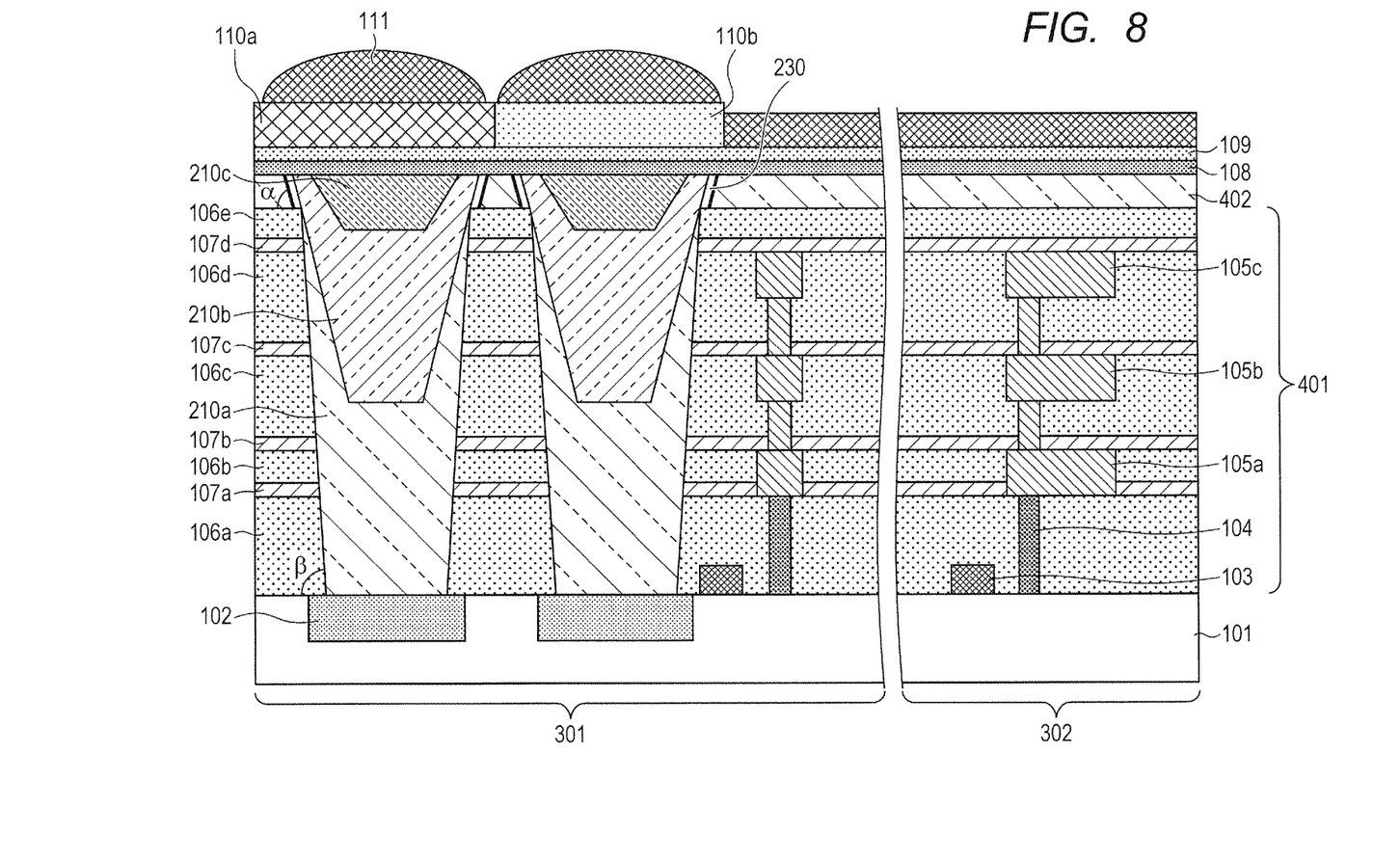
FIG. 8 is a schematic view for illustrating a step of forming a color filter layer and an on-chip lens layer in the method of manufacturing a solid-state image pickup apparatus according to the second embodiment.

FIG. 8 is a schematic view for illustrating a step of forming the color filter layer 110 and the on-chip lens layer 111 on the optical waveguides 210 and the first insulating layer 401. The passivation film 108 and the planarizing layer 109 made of resin are formed on the optical waveguides 210 and the first insulating layer 401. After that, the color filter layers 110a and 110b corresponding to the plurality of colors and the on-chip lens layer 111 are further formed. An inner lens (not shown) may be formed above the optical waveguide 210.

As described above, the method of manufacturing a solid-state image pickup apparatus of this embodiment includes a step of forming, at the boundary between the optical waveguide and the second insulating layer, the light reflecting layer having a refractive index that is lower than a refractive index of the optical waveguide. Further, α<90° is satisfied, where α represents an angle formed by the boundary surface between the light reflecting layer and the second insulating layer with respect to the boundary surface between the first insulating layer and the second insulating layer. With this, leaking-out or leaking-in of light entering a region between adjacent pixels can be suppressed, and the amount of light to be received by the photoelectric converter of the pixel can be increased. Thus, the SN ratio of the pixel signal can be increased.

Third Embodiment

The solid-state image pickup apparatus described above in each embodiment is applicable to various image pickup systems. Examples of the image pickup system include a digital still camera, a digital camcorder, and a monitoring camera.

Figure 9:
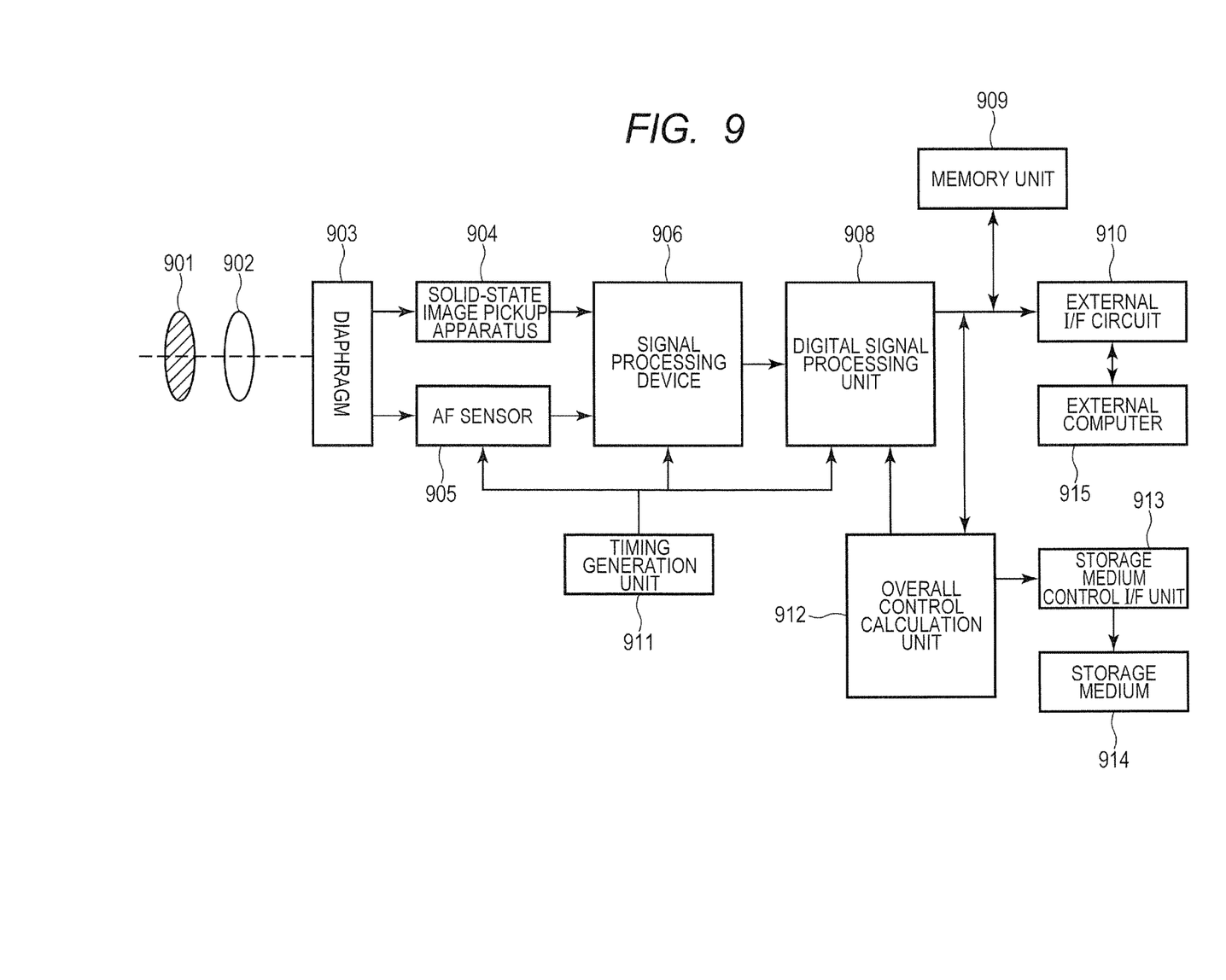
FIG. 9 is a block diagram for illustrating a configuration example of an image pickup system according to a third embodiment of the present invention.

FIG. 9 is a block diagram for illustrating a configuration example of an image pickup system according to a third embodiment of the present invention. The image pickup system illustrated in FIG. 9 includes a barrier 901, a lens 902, a diaphragm 903, a solid-state image pickup apparatus 904, an AF sensor 905, a signal processing device 906, a digital signal processing unit 908, a memory unit 909, a timing generation unit 911, and an overall control calculation unit 912. Other than those units, the image pickup system may include an external I/F circuit 910, a storage medium control I/F unit 913, a storage medium 914, and an external computer 915.

The barrier 901 is configured to protect the lens 902. The lens 902 is configured to form an optical image of an object on the solid-state image pickup apparatus 904. The diaphragm 903 is configured to adjust the amount of light passing through the lens 902. The solid-state image pickup apparatus 904 is the solid-state image pickup apparatus of each embodiment described above, and is configured to acquire the optical image of the object formed by the lens 902 as an image signal. The AF sensor 905 is configured to acquire focal point information for AF processing. The signal processing device 906 is configured to process a signal output from the solid-state image pickup apparatus 904 or the AF sensor 905.

The digital signal processing unit 908 is configured to perform various types of correction on the image data output from the signal processing device 906, and to compress the data. The memory unit 909 is configured to temporarily store the image data. The external I/F circuit 910 is configured to communicate to/from the external computer 915 or the like. The timing generation unit 911 is configured to output various timing signals to the digital signal processing unit 908 and the like. The overall control calculation unit 912 is configured to perform various types of calculation to control the entire camera. The storage medium control I/F unit 913 is configured to control the storage medium 914. The storage medium 914 is a semiconductor memory or the like configured to store or read out the acquired image data. The external computer 915 is an external computer configured to transmit the acquired image data.

Next, how the image pickup system illustrated in FIG. 9 operates when taking an image is described. When the barrier 901 is opened, the overall control calculation unit 912 calculates a distance to the object through phase difference detection based on the signal output from the AF sensor 905.

After that, the following automatic focus control is performed. That is, the lens 902 is driven based on the result of calculation, and whether or not the lens 902 is in focus is determined again. When it is determined that the lens 902 is out of focus, the lens 902 is driven again. Then, after the in-focus state is confirmed, the solid-state image pickup apparatus 904 starts to take an image. When the solid-state image pickup apparatus 904 outputs a signal of the taken image, the overall control calculation unit 912 reads out the image signal output from the solid-state image pickup apparatus 904 via the signal processing device 906 and the digital signal processing unit 908 to write the image signal into the memory unit 909. After that, the overall control calculation unit 912 stores the data accumulated in the memory unit 909 in the storage medium 914 via the storage medium control I/F unit 913. Alternatively, the overall control calculation unit 912 inputs the data to the external computer 915 or the like via the external I/F circuit 910.

As described above, the image pickup system of this embodiment can perform an image pickup operation by employing the solid-state image pickup apparatus 904. The image pickup system may include at least the solid-state image pickup apparatus 904, and the signal processing device 906 configured to process the output signal output from the solid-state image pickup apparatus 904.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-076379, filed Apr. 6, 2016, which is hereby incorporated by reference herein in its entirety.

What is claimed is:

1. A solid-state image pickup apparatus, comprising:
a semiconductor substrate, which has a plurality of photoelectric converters formed thereon;
a first insulating layer, which is formed on the semiconductor substrate, and includes a plurality of wiring lines;
a second insulating layer, which is formed on the first insulating layer, the second insulating layer being made of materials different from the first insulating layer;
an optical waveguide, which is formed above each of the plurality of photoelectric converters and in an opening portion of the first insulating layer, the optical waveguide having a refractive index that is higher than a refractive index of the first insulating layer; and
a light reflecting layer, which is formed at a boundary between the optical waveguide and the second insulating layer, and has a refractive index that is lower than a refractive index of the optical waveguide,
wherein the light reflecting layer is formed on a portion of a side of the optical waveguide,
wherein the following expression is satisfied:

$\alpha < 90°$, where $\alpha$ represents an angle formed by a boundary surface between the light reflecting layer and the second insulating layer with respect to a boundary surface between the first insulating layer and the second insulating layer.

2. A solid-state image pickup apparatus according to claim 1, wherein the following expression is satisfied:

$\alpha < \beta$, where $\beta$ represents an angle formed by a boundary surface between the optical waveguide and the first insulating layer with respect to a boundary surface between the semiconductor substrate and the first insulating layer.

3. A solid-state image pickup apparatus according to claim 1, wherein the second insulating layer and the optical waveguide are each made of silicon nitride.

4. A solid-state image pickup apparatus according to claim 1, wherein the following expression is satisfied:

$\beta < 90°$, where $\beta$ represents an angle formed by a boundary surface between the optical waveguide and the first insulating layer with respect to a boundary surface between the semiconductor substrate and the first insulating layer.

5. A solid-state image pickup apparatus according to claim 1, wherein the optical waveguide and the first insulating layer are formed in contact to each other without interposing the light reflecting layer therebetween.

6. A solid-state image pickup apparatus according to claim 1, wherein the light reflecting layer comprises an air gap.

7. A method of manufacturing a solid-state image pickup apparatus, the method comprising:
forming a plurality of photoelectric converters on a semiconductor substrate;
forming a first insulating layer on the semiconductor substrate;
forming an opening portion in the first insulating layer above each of the plurality of photoelectric converters;
forming a second insulating layer on the first insulating layer;
forming an optical waveguide by filling the opening portion with a buried member having a refractive index that is higher than a refractive index of the first insulating layer; and forming, at a boundary between the optical waveguide and the second insulating layer and on a portion of a side of the optical waveguide, a light reflecting layer having a refractive index that is lower than a refractive index of the optical waveguide, wherein the following expression is satisfied:

$\alpha<90°$, where α represents an angle formed by a boundary surface between the light reflecting layer and the second insulating layer with respect to a boundary surface between the first insulating layer and the second insulating layer.

8. A method of manufacturing a solid-state image pickup apparatus according to claim 7, wherein the forming an optical waveguide comprises:
a first burying step of forming a first buried member in the opening portion; and
a second burying step of forming a second buried member in the opening portion having the first buried member formed therein, and wherein the forming a light reflecting layer comprises:
forming, during a period between the first burying step and the second burying step, on the first buried member, a high etching rate layer having an etching rate that is higher than an etching rate of each of the first buried member and the second buried member;
planarizing the first buried member and the second buried member until the high etching rate layer is exposed; and
forming the light reflecting layer comprising an air gap by removing the high etching rate layer by wet etching.

9. A method of manufacturing a solid-state image pickup apparatus according to claim 7, wherein the forming an optical waveguide comprises:
a first burying step of forming a first buried member in the opening portion; and
a second burying step of forming a second buried member in the opening portion having the first buried member formed therein, and wherein the forming a light reflecting layer comprises:
forming, during a period between the first burying step and the second burying step, on the first buried member, a low refractive index layer having a refractive index that is lower than a refractive index of each of the first buried member and the second buried member; and
planarizing the first buried member and the second buried member until the low refractive index layer is exposed.

10. A method of manufacturing a solid-state image pickup apparatus according to claim 8, wherein the first burying step is carried out in the same step as the forming a second insulating layer.

11. A method of manufacturing a solid-state image pickup apparatus according to claim 9, wherein the first burying step is carried out in the same step as the forming a second insulating layer.

12. An image pickup system, comprising:
a solid-state image pickup apparatus according to claim 1 and
a signal processing device configured to process a signal output from the solid-state image pickup apparatus.

13. A solid-state image pickup apparatus according to claim 1, wherein the second insulating layer is formed above a wiring line in the highest layer of the plurality of wiring lines included in the first insulating layer.

14. A solid-state image pickup apparatus according to claim 1, wherein the light reflecting layer is not formed on at least a portion of the boundary between the optical waveguide and the first insulating layer.

15. A solid-state image pickup apparatus according to claim 6, wherein the first insulating layer is made of silicon oxide as a main component, and the second insulating layer is made of silicon nitride as a main component.

16. A photoelectric converter apparatus comprising:
a semiconductor substrate, which has a plurality of photoelectric converters formed thereon;
a first insulating layer, which is formed on the semiconductor substrate, and includes a plurality of wiring lines;
a second insulating layer, which is formed on the first insulating layer, the second insulating layer being made of materials different from the first insulating layer;
an optical waveguide, which is formed above each of the plurality of photoelectric converters and in an opening portion of the first insulating layer, the optical waveguide being made of materials different from the first insulating layer; and
an air gap formed at a boundary between the optical waveguide and the second insulating layer
wherein the air gap is formed on a portion of a side of the optical waveguide,
wherein the following expression is satisfied:

$\alpha<90°$, where α represents an angle formed by a boundary surface between the air gap and the second insulating layer with respect to a boundary surface between the first insulating layer and the second insulating layer.

17. A photoelectric converter apparatus according to claim 16, wherein the air gap is not formed on at least a portion of the boundary between the optical waveguide and the first insulating layer.

18. A photoelectric converter apparatus according to claim 16, wherein the second insulating layer and the optical waveguide is made of silicon nitride as a main component.

19. A photoelectric converter apparatus according to claim 18, wherein the first insulating layer is made of silicon oxide as a main component.

20. A photoelectric converter apparatus according to claim 19, wherein the second insulating layer is formed above a wiring line in the highest layer of the plurality of wiring lines included in the first insulating layer.

21. A photoelectric converter apparatus according to claim 16, wherein the following expression is satisfied:

$\alpha<\beta$, where β represents an angle formed by a boundary surface between the optical waveguide and the first insulating layer with respect to a boundary surface between the semiconductor substrate and the first insulating layer.

22. An image pickup system, comprising:
a photoelectric converter apparatus according to claim 16; and
a signal processing device configured to process a signal output from the photoelectric converter apparatus.

* * * * *